(12) United States Patent
Bao et al.

(10) Patent No.: US 12,402,507 B2
(45) Date of Patent: Aug. 26, 2025

(54) OLED DISPLAY SUBSTRATE, METHOD OF MANUFACTURING THE SAME AND OLED DISPLAY APPARATUS

(71) Applicants: Chengdu BOE Optoelectronics Technology Co., Ltd., Sichuan (CN); BOE TECHNOLOGY GROUP CO., LTD., Beijing (CN)

(72) Inventors: Jiandong Bao, Beijing (CN); Hongcheng Gao, Beijing (CN); Can Huang, Beijing (CN); Yuan He, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 655 days.

(21) Appl. No.: 17/642,259

(22) PCT Filed: May 14, 2021

(86) PCT No.: PCT/CN2021/093795
§ 371 (c)(1),
(2) Date: Mar. 11, 2022

(87) PCT Pub. No.: WO2021/228219
PCT Pub. Date: Nov. 18, 2021

(65) Prior Publication Data
US 2022/0320183 A1    Oct. 6, 2022

(30) Foreign Application Priority Data
May 15, 2020    (CN) .......................... 202010413640.0

(51) Int. Cl.
*H10K 59/38*    (2023.01)
*H10K 50/86*    (2023.01)
(Continued)

(52) U.S. Cl.
CPC ........... *H10K 59/38* (2023.02); *H10K 50/865* (2023.02); *H10K 59/8792* (2023.02);
(Continued)

(58) Field of Classification Search
CPC .. H10K 59/38; H10K 50/865; H10K 59/8792; H10K 71/00; H10K 59/1201;
(Continued)

(56) References Cited

U.S. PATENT DOCUMENTS 7,697,053 B2 *    4/2010    Kurtz .................... H10K 59/65
                                                                 348/340
2008/0042136 A1    2/2008    Lee
(Continued)

FOREIGN PATENT DOCUMENTS

CN    109411519 A *    3/2019    ......... H01L 27/3232
CN    110838262 A    2/2020
(Continued)

OTHER PUBLICATIONS

China Patent Office, CN202010413640.0 First Office Action issued on Apr. 29, 2022.

*Primary Examiner* — Jonathan Han
(74) *Attorney, Agent, or Firm* — HOUTTEMAN LAW LLC

(57) ABSTRACT

An OLED display substrate, a method of manufacturing the same and an OLED display apparatus are provided, and the display substrate includes a substrate base; a device layer including OLED light-emitting devices; an encapsulation layer on respective sides of the OLED light-emitting devices away from the substrate base; a black matrix layer on a side of the encapsulation layer away from the substrate base, the black matrix layer including openings; and a color filter layer on a side of the black matrix away from the substrate base, the color filter layer including color filters correspond- (Continued)

ingly provided on respective sides of the openings away from the substrate base, the color filters include working color filters and at least one common color filter; area of each common color filter on the substrate base is more than 50 times as large as area of any working color filter on the substrate base.

18 Claims, 4 Drawing Sheets

(51) Int. Cl.
  *H10K 59/12* (2023.01)
  *H10K 59/122* (2023.01)
  *H10K 59/80* (2023.01)
  *H10K 71/00* (2023.01)
  *H10K 77/10* (2023.01)
  *H10K 102/00* (2023.01)
(52) U.S. Cl.
  CPC ......... *H10K 71/00* (2023.02); *H10K 59/1201* (2023.02); *H10K 59/122* (2023.02); *H10K 77/111* (2023.02); *H10K 2102/311* (2023.02)

(58) Field of Classification Search
  CPC ............... H10K 59/122; H10K 77/111; H10K 2102/311; H10K 59/352; H10K 59/353; Y02E 10/549
  See application file for complete search history.

(56) References Cited

U.S. PATENT DOCUMENTS

| | | | | |
|---|---|---|---|---|
| 2008/0165267 | A1* | 7/2008 | Cok | H04N 7/144 |
| | | | | 348/E5.022 |
| 2021/0351236 | A1* | 11/2021 | Shin | H10K 59/873 |
| 2022/0085119 | A1* | 3/2022 | Huang | H10K 59/38 |

FOREIGN PATENT DOCUMENTS

| | | |
|---|---|---|
| CN | 110933888 A | 3/2020 |
| CN | 111081741 A | 4/2020 |
| CN | 111081752 A | 4/2020 |
| CN | 111554829 A | 8/2020 |

* cited by examiner

OLED DISPLAY SUBSTRATE, METHOD OF MANUFACTURING THE SAME AND OLED DISPLAY APPARATUS

CROSS-REFERENCE TO RELATED APPLICATIONS

The present disclosure claims the priority of the Chinese Patent Application No. 202010413640.0, filed on May 15, 2020, the entire contents of which are incorporated herein by reference.

TECHNICAL FIELD

The present disclosure relates to the field of display technology, and more particularly, relates to an organic light-emitting diode (OLED) display substrate, a method of manufacturing the same and an OLED display apparatus.

BACKGROUND

Since OLED displays have many advantages, such as self-luminance, low driving voltage, high luminous efficiency, fast response time, high definition and contrast, wide operating temperature range and the ability to realize flexible displays, they have been extensively applied in the fields of display, lighting, smart wear and the like.

SUMMARY

The present disclosure provides an OLED display substrate, a method of manufacturing the same and an OLED display apparatus.

In one embodiment, the OLED display substrate includes: a substrate base; an OLED device layer provided on the substrate base and including a plurality of OLED light-emitting devices; an encapsulation layer provided on respective sides of the plurality of OLED light-emitting devices away from the substrate base; a black matrix layer arranged on a side of the encapsulation layer away from the substrate base, wherein the black matrix layer includes a plurality of openings, and the plurality of openings include a plurality of working openings and at least one common opening; and a color filter layer arranged on a side of the black matrix layer away from the substrate base, the color filter layer including a plurality of color filters that are provided on respective sides of the plurality of openings away from the substrate base and are placed opposite the plurality of OLED light-emitting devices, wherein an area of an orthographic projection of one common opening of the at least one common opening on the substrate base is more than 50 times as large as an area of an orthographic projection of any working opening of the plurality of working openings on the substrate base.

In one embodiment, the plurality of color filters include a plurality of working color filters and at least one common color filter; and orthographic projections of the plurality of working color filters on the substrate base cover orthographic projections of the plurality of working openings on the substrate base, respectively, and at least one orthographic projection of the at least one common color filter on the substrate base covers at least one orthographic projection of the least one common opening on the substrate base, respectively.

In one embodiment, an area of an orthographic projection of each common color filter of the at least one common color filter on the substrate base is more than 100 times as large as an area of an orthographic projection of any working color filter of the plurality of working color filters on the substrate base.

In one embodiment, a shape of the orthographic projection of the common color filter on the substrate base is a circle, a rectangle, or a polygon.

In one embodiment, a diameter of the orthographic projection of the common color filter on the substrate base is no more than 10 mm.

In one embodiment, luminous transmittance of each common color filter of the at least one common color filter is smaller than luminous transmittance of any working color filter of the plurality of working color filters.

In one embodiment, a material of the common color filter is an acrylic material.

In one embodiment, the plurality of working color filters include color filters of a plurality of colors, and each working color filter of the plurality of working color filters is placed opposite an OLED light-emitting device corresponding to the working color filter in the OLED device layer so as to filter light emitted by the OLED light-emitting device for display.

In one embodiment, the at least one common color filter is located between the plurality of working color filters.

In one embodiment, the at least one common color filter and one working color filter of the plurality of working color filters are made of an identical material and have an identical color, and a thickness of the common color filter is greater than a thickness of the working color filter.

In one embodiment, the at least one common color filter and one working color filter of the plurality of working color filters have an identical thickness, and luminous transmittance of the common color filter is smaller than luminous transmittance of the working color filter.

In one embodiment, the plurality of color filters include a plurality of working color filters and a plurality of common color filters; orthographic projections of the plurality of working color filters on the substrate base cover orthographic projections of the plurality of working openings on the substrate base, respectively; and orthographic projections of the plurality of common color filters on the substrate base cover at least one orthographic projection of the least one common opening on the substrate base, and at least two common color filters are provided in each common opening of the at least one common opening.

In one embodiment, the plurality of working color filters and the plurality of common color filters are arranged to correspond to the plurality of OLED light-emitting devices, respectively, and the plurality of common color filters and the plurality of working color filters both include identical color filters of a plurality of colors, and a common color filter and a working color filter that have an identical color are made of an identical material.

In one embodiment, luminous transmittance of the plurality of common color filters in the at least one common opening is smaller than luminous transmittance of the plurality of working color filters.

In one embodiment, a thickness of each common color filter of the plurality of common color filters is greater than a thickness of a working color filter having an identical color as the common color filter.

In one embodiment, a material of the substrate base is a flexible material, and a material of the encapsulation layer is a transparent material.

A method of manufacturing an OLED display substrate according to the present disclosure includes: forming an OLED device layer including a plurality of OLED light-emitting devices on a substrate base; forming an encapsulation layer on respective sides of the plurality of OLED light-emitting devices away from the substrate base; forming a black matrix layer including a plurality of openings on a side of the encapsulation layer away from the substrate base, such that the plurality of openings include a plurality of working openings and at least one common opening; forming a color filter layer on a side of the black matrix layer away from the substrate base, such that the color filter layer includes a plurality of color filters, the plurality of color filters include a plurality of color filters that are provided on respective sides of the plurality of openings away from the substrate base and are placed opposite the plurality of OLED light-emitting devices, and an area of an orthographic projection of one common opening of the at least one common opening is more than 50 times as large as an area of an orthographic projection of any working opening of the plurality of working openings on the substrate base.

In one embodiment, the forming the color filter layer on the side of the black matrix layer away from the substrate base includes: forming, at a temperature below 95 degrees, a plurality of working color filters and at least one common color filter in the plurality of working openings and the at least one common opening, respectively, such that orthographic projections of the plurality of working color filters on the substrate base cover orthographic projections of the plurality of working openings on the substrate base, respectively, and at least one orthographic projection of the at least one common color filter on the substrate base covers at least one orthographic projection of the at least one common opening on the substrate base, respectively.

In one embodiment, the forming the color filter layer on the side of the black matrix layer away from the substrate base includes: forming, at a temperature below 95 degrees, a plurality of working color filters and a plurality of common color filters in the plurality of working openings and the at least one common opening, respectively, such that the plurality of working color filters and the plurality of common color filters are arranged to correspond to the plurality of OLED light-emitting devices, respectively, and orthographic projections of the plurality of working color filters on the substrate base cover orthographic projections of the plurality of working openings on the substrate base, respectively; and such that orthographic projections of the plurality of common color filters on the substrate base cover at least one orthographic projection of the at least one common opening, and at least two common color filters are provided in each common opening of the at least one common opening.

The OLED display apparatus according to the present disclosure includes the OLED display substrate as described above, and at least one camera placed on a side of the substrate base of the OLED display substrate away from the color filter layer, wherein at least one orthographic projection of the at least one camera on the substrate base is located within at least one range of the at least one orthographic projection of the at least one common color filter in the color filter layer of the OLED display substrate on the substrate base, respectively.

BRIEF DESCRIPTION OF THE DRAWINGS

In order to illustrate the embodiments of the present disclosure more clearly, a brief description will hereinafter be given to the accompanying drawings relating thereto. Apparently, the accompanying drawings as described below just show some embodiments of the present disclosure. However, the present disclosure is not limited thereto.

DETAILED DESCRIPTION OF THE EXEMPLARY EMBODIMENTS

Figure 1:
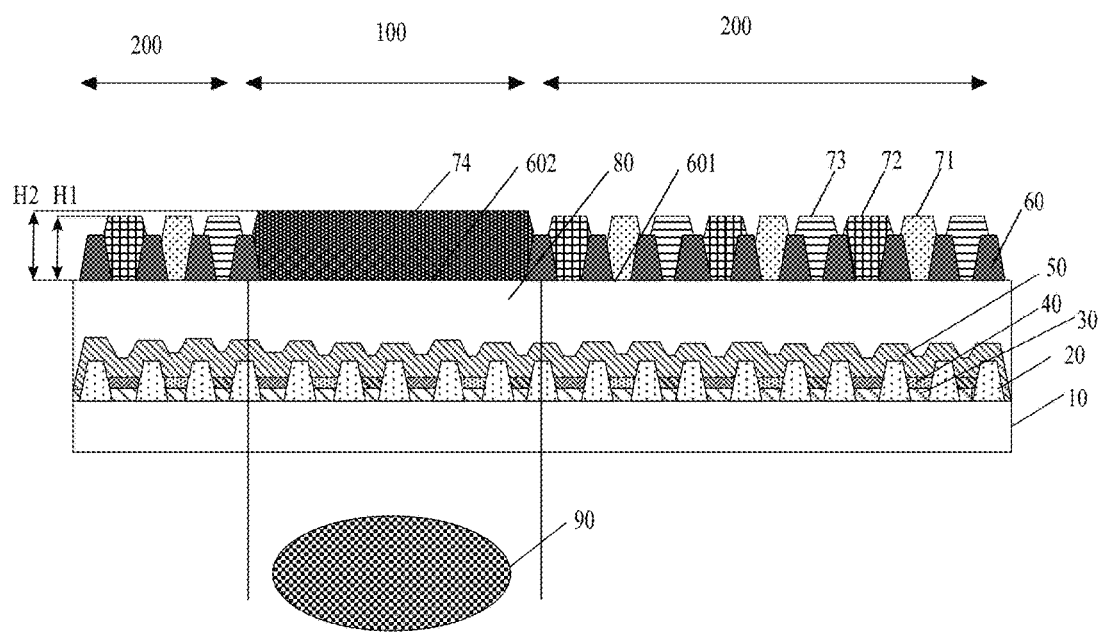
FIG. 1 is a cross-sectional view of a structure of an OLED display apparatus including an under-screen camera provided in some embodiments of the present disclosure.

In a conventional OLED display substrate, a polarizer (POL) is typically provided to reduce reflectivity of the display substrate under strong light. Although the polarizer can effectively reduce the reflectivity of the display substrate under strong light, it also reduces light extraction efficiency of the display substrate by nearly 58%, which causes a major disadvantage to the OLED display substrate. Besides, the polarizer is characterized by a large thickness, a fragile material and the like, which are not beneficial to the development of a flexible product.

In order to develop a flexible product based on OLED display technology, a Pol-less (polarizer-free) technique has been proposed. For example, a color filter layer is employed to replace the polarizer, which can not only reduce a thickness of a functional layer from around 100 µm to less than 5 µm, but also increase the light extraction efficiency from 42% to 60%. Specifically, the color filter layer typically includes red (R), green (G) and blue (B) color filters to fill a plurality of openings included in a black matrix layer. Based on the characteristics of self-luminance of OLED light-emitting devices, the color filters of various colors in the color filter layer correspond to red, green and blue sub-pixel units, respectively.

Furthermore, with the development of OLED technology, techniques of integrating an OLED display substrate with a camera are gaining more attention than ever before. The present disclosure proposes an OLED display substrate based on the Pol-less technique, and this OLED display substrate can be organically integrated with an under-screen camera to improve the performance of an OLED display apparatus.

The OLED display apparatus according to the present disclosure includes an OLED display substrate and a camera provided under the OLED display substrate; and the OLED display substrate includes a color filter layer, which is used to replace a polarizer, and a black matrix layer. That is, the OLED display substrate according to the present disclosure is an OLED display substrate based on the Pol-less technique. On the OLED display substrate, a black matrix material is not provided at a position corresponding to the camera, so as to allow light to be transmitted to the camera. In a state in which a screen is turned off, the function of reducing reflectivity is lost at the position where the black matrix material is not provided on a light-emitting side of the OLED display apparatus, which will result in a hue difference between this position and a surrounding position where the black matrix material is provided. In order to solve this problem, in the present disclosure, a specific color filter (which may be referred to as a common color filter (CF) hereinafter) is formed in the color filter layer of the OLED display substrate and is located at a position corresponding to the under-screen camera to be provided, thereby avoiding the hue difference visible to the naked eye between a region where the black matrix material is not provided and a region where the black matrix material is provided, in the state in which the screen is turned off.

The OLED display substrate according to the present disclosure includes: a substrate base, which may be a flexible substrate base; an OLED device layer provided on the substrate base and including a plurality of OLED light-emitting devices; an encapsulation layer, which is provided on respective sides of the plurality of OLED light-emitting devices away from the substrate base, and on top of which a planarization layer may be further formed; a black matrix layer provided on a side of the encapsulation layer away from the substrate base and including a plurality of openings, the plurality of openings including a plurality of working openings and at least one common opening, wherein each common opening of the at least one common opening is substantially larger than each working opening of the plurality of working openings, for example, an area of the common opening is tens to hundreds of times as large as an area of the working opening, and for example, an area of an orthographic projection of each common opening of the at least one common opening on the substrate base is more than 50 or 100 times as large as an area of an orthographic projection of any working opening of the plurality of working openings on the substrate base; and a plurality of color filters respectively provided in the plurality of openings, wherein a color filter provided in a common opening that is larger than a working opening is the common color filter, and a color filter provided in a working opening is a working color filter. In other words, in the present disclosure, a plurality of working color filters respectively corresponding to the plurality of OLED light-emitting devices and a common color filter corresponding to a region where the under-screen camera is to be provided (which may also be referred to as an under-screen camera color filter) are formed in the color filter layer of the OLED display substrate, and an area of the common color filter is substantially larger than that of a working color filter for filtering light emitted by an OLED light-emitting device. That is, an area of the common color filter should be matched with a size of the under-screen camera to be provided. For example, if the orthographic projection of the common color filter on the substrate base is a circle, a diameter of the orthographic projection of the common color filter on the substrate base is no more than 10 mm.

Figure 2:
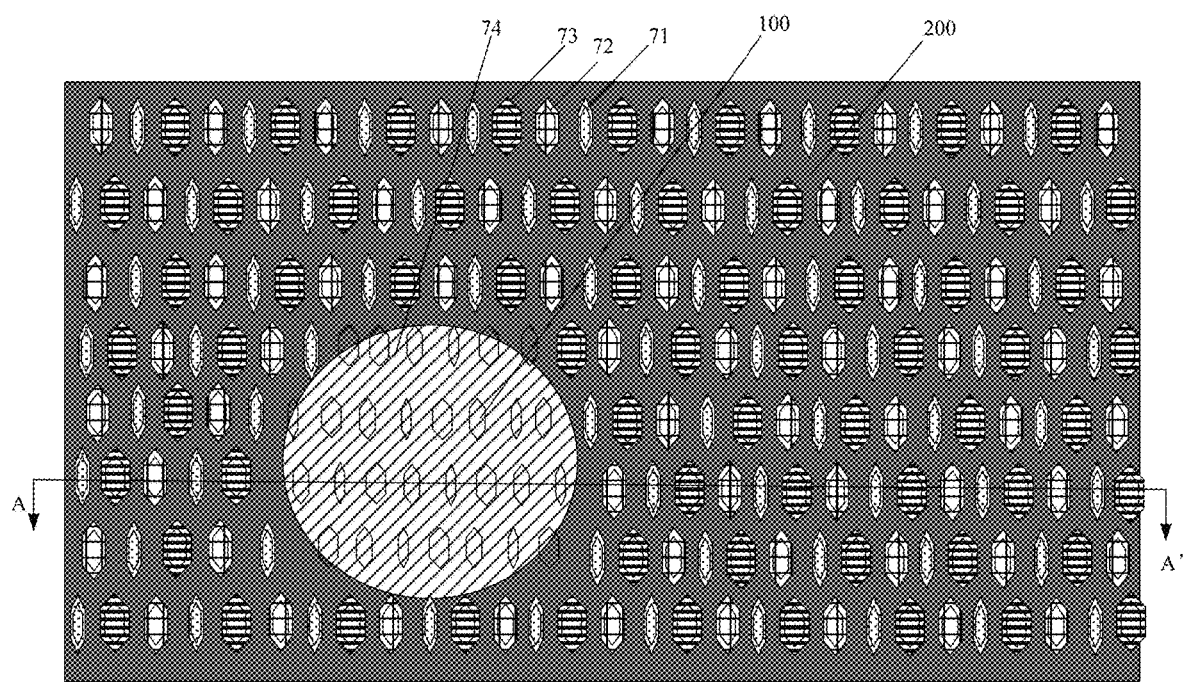
FIG. 2 is a plan view of an OLED display substrate provided in some embodiments of the present disclosure.

Specifically, as shown in FIG. 1 which is a cross-sectional view of an OLED display substrate in FIG. 2 taken along a line AA', the OLED display substrate according to the present disclosure includes: a substrate base 10; an OLED device layer formed on the substrate base 10, the OLED device layer including a plurality of OLED light-emitting devices and further including a pixel definition layer 20 formed on the substrate base 10, a discrete anode 30 of each OLED light-emitting device, a luminescent layer 40 of each OLED light-emitting device and a cathode layer 50 that is shared by the plurality of OLED light-emitting devices; an encapsulation layer 80 formed on the cathode layer 50, wherein an upper surface of the encapsulation layer 80 may be flat or an independent planarization layer may be formed on top of the encapsulation layer 80; a black matrix layer 60 provided on a side of the flat encapsulation layer 80 away from the substrate base 10, the black matrix layer 60 including a plurality of openings which include at least one common opening 602 and a plurality of working openings 601; and a color filter layer arranged on a side of the black matrix 60 away from the substrate base 10, the color filter layer including a plurality of color filters correspondingly provided on respective sides of the plurality of openings away from the substrate base.

Figure 6:
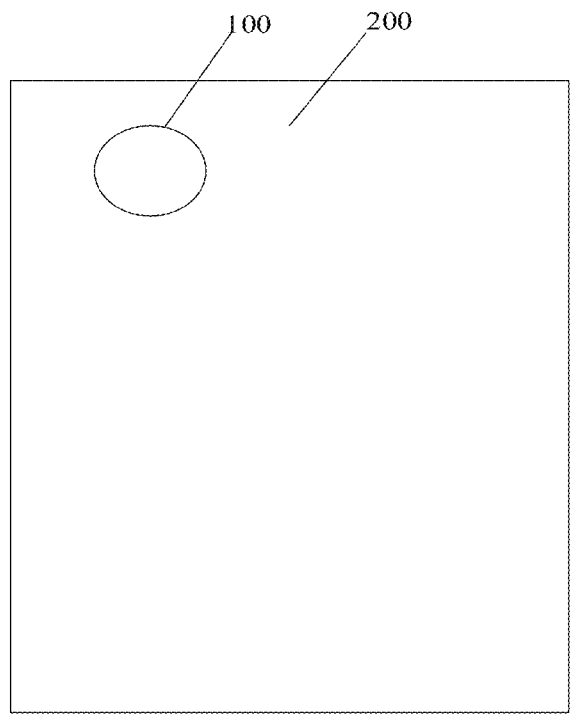
FIG. 6 is a schematic view of an appearance of an OLED display apparatus including an under-screen camera provided in some embodiments of the present disclosure.

The color filter layer may be divided into a working region 200 and an under-screen camera region 100, as shown in FIG. 6, and the under-screen camera region 100 may be provided at the middle or an edge of the working region 200 according to needs. Color filters of various colors, such as blue color filters 73, red color filters 72 and green color filters 71, may be provided in the working region 200; and a common color filter 74 is provided in the under-screen camera region 100 corresponding to the common opening 602. As can be seen from FIGS. 1 and 2, an area of the common filter 74 is substantially larger than that of any one of the blue color filters 73, the red color filters 72 and the green color filters 71, and a position and a size of the common filter 74 correspond to those of a camera 90 provided under the OLED display substrate, respectively. In other words, orthographic projections of the plurality of working color filters on the substrate base cover those of the plurality of working openings on the substrate base, respectively, and at least one orthographic projection of the at least one common color filter on the substrate base covers at least one orthographic projection of the at least one common opening on the substrate base, respectively. As can be seen from FIG. 1, the black matrix layer defines, across the under-screen camera region 100, an opening whose area is substantially larger than that of any one of the openings for the blue color filters 73, the red color filters 72 and the green color filters 71. That is, the common color filter 74 as one piece is formed in the entire under-screen camera region 100, and the common color filter 74 as one piece does not include any material of the black matrix layer, so as to allow light to be transmitted to the camera 90.

As shown in FIG. 2, the plurality of openings defined by the black matrix layer 60 are filled by the plurality of color filters, such as the plurality of blue color filters 73, the plurality of red color filters 72, the plurality of green color filters 71 and the common color filter 74 in the under-screen camera region 100. As shown in FIGS. 1 and 2, the common opening defined by the black matrix layer 60 across the under-screen camera region 100 is substantially larger than any one of the working openings formed for arranging the plurality of blue color filters 73, the plurality of red color filters 72 and the plurality of green color filters 71. For example, the common opening may cover tens to hundreds of sub-pixel regions on the display substrate. It is to be noted that FIG. 2 is not drawn to scale and just schematically shows the common color filter 74 covering a plurality of OLED light-emitting devices formed on the substrate base 10. It is possible to define a size and a shape of the opening defined by the black matrix layer for the common color filter 74 according to a practical application, for example, according to the size of the under-screen camera. For example, the area of the orthographic projection of the common color filter 74 on the substrate base 10 is at least 50 times as large as that of any working color filter of the plurality of working color filters on the substrate base 10.

As shown in FIGS. 1 and 2, the common opening for the common color filter 74 among the plurality of openings defined by the black matrix layer does not include any black matrix material, and therefore, light can be directly transmitted to the under-screen camera 90 under the substrate base 10 without being blocked by the black matrix material.

As shown in FIG. 2, the orthographic projection of the common color filter 74 on the substrate base 10 may be a circle whose diameter is typically no more than 10 mm. However, the present disclosure is not limited thereto, and the orthographic projection of the common color filter 74 on the substrate base 10 may be configured to have other shapes or sizes (e.g., the shape and size of the camera) according to needs. For example, the shape of the common color filter 74 may alternatively be a rectangle or a polygon.

In another aspect, in order to ensure that the hue difference between the common color filter 74 and the working color filters surrounding it, in the state in which the screen is turned off, is eliminated, luminous transmittance of the common color filter 74 may be selected to be smaller than that of the working color filters surrounding it, for example, to be smaller than that of the blue color filters 73, the red color filters 72 and the green color filters 71, so as to ensure a uniform hue at all regions of the color filter layer in the state in which the screen is turned off.

For example, a material of the common color filter 74 may be an acrylic material, and its luminous transmittance per unit thickness (i.e., per micrometer) may be between 60% and 90%. For conventional blue color filters 73, red color filters 72 and green color filters 71, their luminous transmittance per unit thickness (i.e., per micrometer) ranges from 45% to 75%; and typically, luminous transmittance of the red color filters is greater than that of the green color filters, which is in turn greater than that of the blue color filters. Therefore, desirable luminous transmittance can be achieved by adjusting respective thicknesses of various color filters in the color filter layer, so as to ensure the uniform hue at all the regions of the color filter layer in the state in which the screen is turned off.

In one embodiment, a color of the common color filter may be that of any one of the red color filters, the green color filters and the blue color filters. As such, the common color filter can be formed at the same time as the working color filters of the same color are formed, thereby simplifying the relevant process. As described above, in order to ensure the uniformity of the respective hues of the under-screen camera region and the working region in the state in which the screen is turned off, the thickness of the common color filter may be configured to be greater than that of a working color filter of the same color, such that the luminous transmittance of the common color filter is smaller than that of the working color filter. For example, if the common color filter 74 is manufactured by using the same material as the red color filter 72, the thickness H2 of the common color filter 74 is greater than the thickness H1 of the red color filter 72.

In the embodiment shown in FIGS. 1 and 2, the common color filter provided in the common opening is made of a color filter material as one piece, which can ensure that the under-screen camera 100 at a position corresponding to the under-screen camera region 100 can capture uniform and high-quality images. For example, the material of the common color filter as one piece in each common opening may be that of any one of the working color filters of various colors, and as such, the common color filter can be manufactured at the same time as the working color filters of the corresponding color are manufactured, thereby simplifying the process; alternatively, the material of the common color filter as one piece in each common opening may be a color filter material other than the materials of the working color filters of various colors, whereby a desirable material can be freely selected for the common color filter according to needs so as to achieve the desirable luminous transmittance.

However, the present disclosure is not limited thereto. Two or more discrete color filters may be provided in one common opening, as long as the black matrix material, which would prevent light from being transmitted to the camera, is not present in the common opening corresponding to the under-screen camera region 100 under which the camera is provided.

Figure 3:
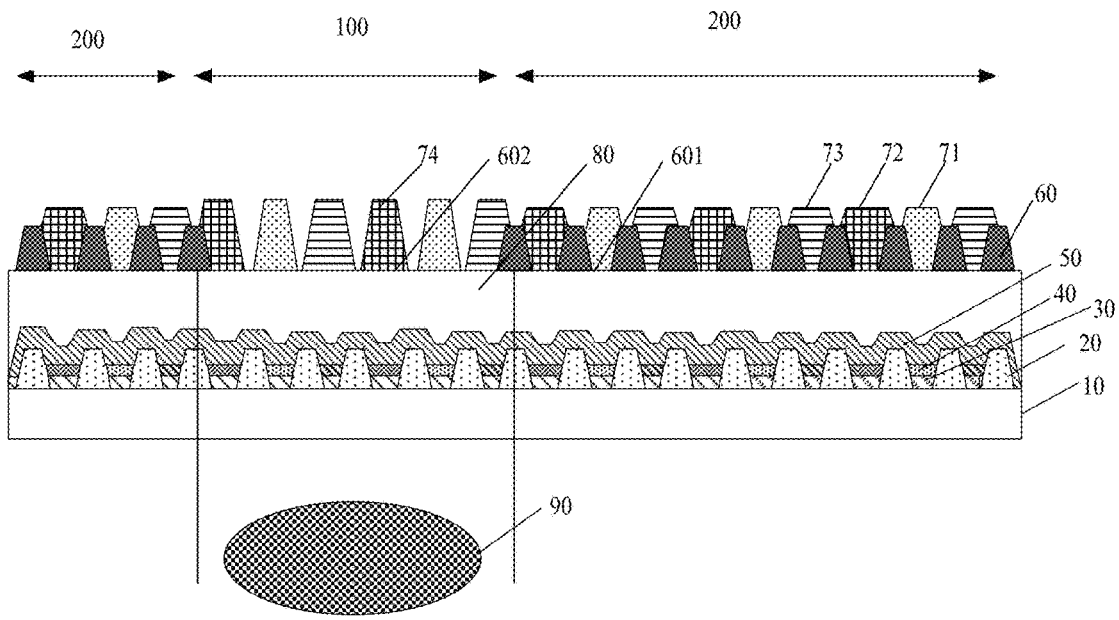
FIG. 3 is a cross-sectional view of a structure of an OLED display apparatus including an under-screen camera provided in some embodiments of the present disclosure.
Figure 4:
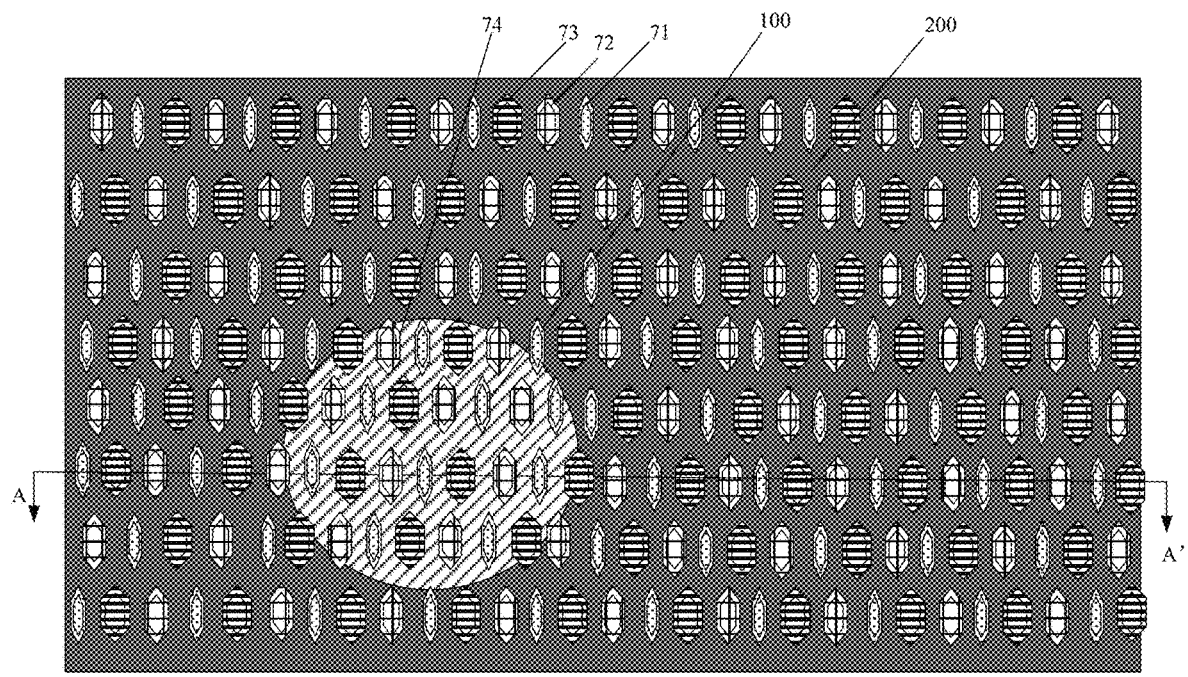
FIG. 4 is a plan view of an OLED display substrate provided in some embodiments of the present disclosure.

FIGS. 3 and 4 show a cross-sectional view and a plan view of an OLED display substrate according to another embodiment of the present disclosure, respectively. In the embodiment shown in FIGS. 3 and 4, a plurality of discrete color filters are provided in one common opening, compared to the embodiment shown in FIGS. 1 and 2. The black matrix material is not provided between these color filters. For example, a plurality of pieces of color filter materials in one common opening may be a plurality of common color filters identical to a plurality of working color filters formed by the same manufacturing process, respectively. As shown in FIG. 3, the plurality of common color filters 74 provided in the under-screen camera region 100 and placed above the camera 90 may be manufactured at the same time as the green color filters 71, the red color filters 72 and the blue color filters 73 in the working region 200 are manufactured.

In addition, in order to ensure the uniformity of the respective hues of the under-screen camera region and the working region in the state in which the screen is turned off, a thickness of a common color filter may be configured to be greater than that of a working color filter of the same color, such that the luminous transmittance of the common color filter is smaller than that of the working color filter.

Other structures in the OLED display substrate according to the embodiment shown in FIGS. 3 and 4 are the same as those in the OLED display substrate shown in FIGS. 1 and 2, and will not be repeated herein.

The substrate base 10 may be a flexible substrate base, upon which a pixel driving circuit to drive the OLED light-emitting devices to emit light may be provided.

The encapsulation layer 80, for example, is a thin-film encapsulation layer whose thickness is around 4 μm to 15 μm and which is made of a transparent material, so as to ensure that light emitted by the OLED light-emitting devices is transmitted to the color filters of corresponding colors in the color filter layer.

The camera 90 may include a digital image sensor and a lens structure.

Figure 5:
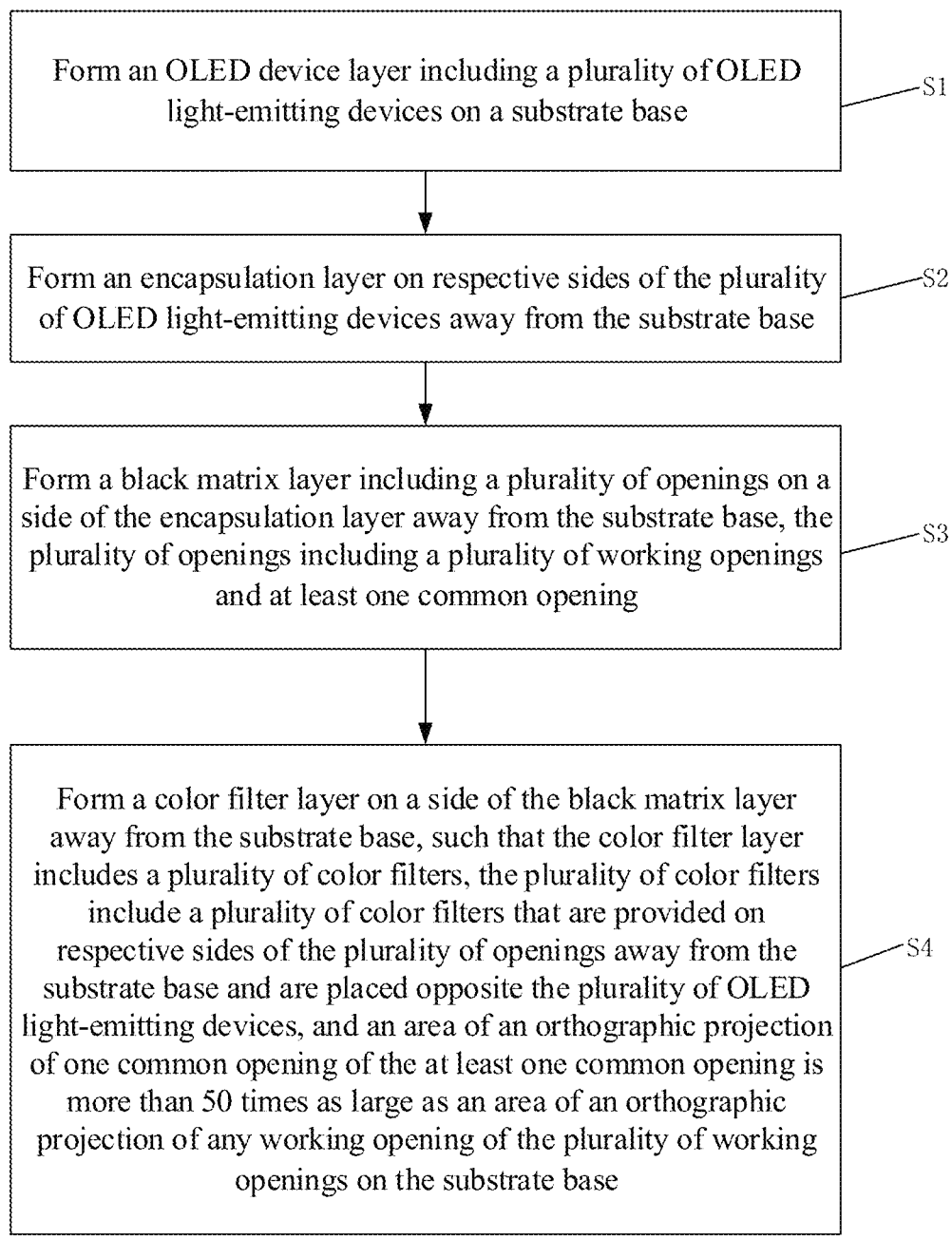
FIG. 5 is a flow chart showing a method of manufacturing an OLED display substrate provided in some embodiments of the present disclosure.

According to another aspect of the present disclosure, there is provided a method of manufacturing an OLED display substrate, and as shown in FIG. 5, the method includes the following steps S1 to S4:

Step S1: Form an OLED device layer including a plurality of OLED light-emitting devices on a substrate base 10;

Step S2: Form an encapsulation layer 80 on respective sides of the plurality of OLED light-emitting devices away from the substrate base 10;

Step 3: Form a black matrix layer 60 including a plurality of openings on a side of the encapsulation layer 80 away from the substrate base 10, the plurality of openings including a plurality of working openings 601 and at least one common opening 602; and Step S4: Form a color filter layer on a side of the black matrix layer 60 away from the substrate base 10, such that the color filter layer includes a plurality of color filters, which are provided on respective sides of the plurality of openings away from the substrate base 10 and are placed opposite to the plurality of OLED light-emitting devices, and an area of an orthographic projection of one common opening of the at least one common opening on the substrate base 10 is more than 50 times as large as that of any working opening of the plurality of working openings on the substrate base 10.

Specifically, the forming the OLED device layer including the plurality of OLED light-emitting devices on the substrate base 10 includes: forming a plurality of discrete anodes 30 for the plurality of OLED light-emitting devices on the substrate base 10; forming a pixel definition layer 20 including a plurality of pixel definition openings to define a plurality of sub-pixel regions and exposing a plurality of discrete anodes 30 through the plurality of pixel definition openings; forming a plurality of luminescent layers 40 in the plurality of pixel definition openings of the pixel definition layer, such that each of the plurality of luminescent layers 40 covers a sub-pixel region; and forming a common cathode layer 50 on the plurality of luminescent layers 40.

In one embodiment, the black matrix layer 60 which defines a plurality of openings is formed on the encapsulation layer 80, such that the plurality of openings include a plurality of working openings and at least one common opening, and an area of an orthographic projection of each common opening of the at least one common opening on the substrate base 10 is at least 50 times as large as an area of an orthographic projection of any working opening of the plurality of working openings on the substrate base 10; and an acrylic material is deposited in the plurality of openings at a temperature below 95 degrees to form a plurality of color filters, respectively, wherein at least one common color filter is formed in the common opening.

For example, a plurality of working color filters and at least one common color filter 74 are formed at a temperature below 95 degrees in the plurality of working openings and the at least one common opening, respectively, such that orthographic projections of the plurality of working color filters on the substrate base cover those of the plurality of working openings on the substrate base, respectively, and at least one orthographic projection of the at least one common color filter on the substrate base covers at least one orthographic projection of the at least one common opening on the substrate base, respectively, as shown in FIGS. 1 and 2.

In addition, a plurality of working color filters and a plurality of common color filters may be formed at a temperature below 95 degrees in the plurality of working openings and the at least one common opening, respectively, such that the plurality of working color filters and the plurality of common color filters are arranged to correspond to the plurality of OLED light-emitting devices, respectively, and orthographic projections of the plurality of working color filters on the substrate base cover those of the plurality of working openings on the substrate base, respectively; and such that orthographic projections of the plurality of common color filters on the substrate base cover at least one orthographic projection of the at least one common opening on the substrate base, and at least two common color filters are provided in each common opening of the at least one common opening, as shown in FIGS. 3 and 4.

For example, the forming the black matrix layer 60 which defines the plurality of openings on the encapsulation layer 80 includes: forming an entire layer of black matrix material over the encapsulation layer 80; coating and pre-baking a photoresist on the entire layer of black matrix material, and then, exposing, developing and baking the photoresist using a mask corresponding to a pattern of the black matrix layer which defines the plurality of openings, thereby forming a photoresist pattern; and etching the entire layer of black matrix material using the photoresist pattern, thereby forming the black matrix layer which defines the plurality of openings.

After the black matrix layer which includes the plurality of openings has been formed, the plurality of red color filters, the plurality of green color filters, the plurality of blue color filters and the at least one common color filter are sequentially formed in the respective openings corresponding thereto. However, the sequence of forming these color filters is not limited thereto. As described above, if the color of the common color filter is the same as that of any one of the red color filters, the green color filters and the blue color filters, these color filters of the same color may be formed at the same time. The present disclosure is not limited thereto.

As described above, in order to ensure the uniform hue of all the regions in the state in which the screen is turned off, process parameters for forming the color filters of various colors are adjusted according to the respective thicknesses of the color filters to be formed.

According to another aspect of the present disclosure, there is provided an OLED display apparatus, including the OLED display substrate as described above and the camera 90 placed on a side of the substrate base 10 of the OLED display substrate away from the color filter layer, wherein an orthographic projection of the camera 90 is located within the orthographic projection of the common color filter 74 in the color filter layer of the OLED display substrate on the substrate base 10.

The OLED display apparatus may be an electrical apparatus with a display function, such as a television, a cell phone, a display, a computer, a tablet computer, a hand-held terminal and the like.

The present disclosure was described as above. However, the present disclosure is not limited to the foregoing description, and modifications of the embodiments described above may be made by a person skilled in the art in light of the concept behind the present disclosure without departing from the protection scope thereof.

The invention claimed is:

1. An OLED display substrate, comprising:
a substrate base;
an OLED device layer provided on the substrate base and comprising a plurality of OLED light-emitting devices;
an encapsulation layer provided on respective sides of the plurality of OLED light-emitting devices away from the substrate base;
a black matrix layer arranged on a side of the encapsulation layer away from the substrate base, wherein the black matrix layer comprises a plurality of openings, the plurality of openings comprise a plurality of working openings and at least one common opening, and an area of an orthographic projection of each common opening of the at least one common opening on the substrate base is more than 50 times as large as an area of an orthographic projection of any working opening of the plurality of working openings on the substrate base; and
a color filter layer arranged on a side of the black matrix layer away from the substrate base, the color filter layer comprising a plurality of color filters that are provided on respective sides of the plurality of openings away from the substrate base and are placed opposite to the plurality of OLED light-emitting devices,
the plurality of color filters comprise a plurality of working color filters and at least one common color filter; and orthographic projections of the plurality of working color filters on the substrate base cover orthographic projections of the plurality of working openings on the substrate base, respectively, and at least one orthographic projection of the at least one common color filter on the substrate base covers at least one orthographic projection of the least one common opening on the substrate base, respectively, and luminous transmittance of each common color filter of the at least one common color filter is smaller than luminous transmittance of any working color filter of the plurality of working color filters.

2. The OLED display substrate according to claim 1, wherein an area of an orthographic projection of each common color filter of the at least one common color filter on the substrate base is more than 100 times as large as an area of an orthographic projection of any working color filter of the plurality of working color filters on the substrate base.

3. The OLED display substrate according to claim 1, wherein
a shape of the orthographic projection of the common color filter on the substrate base is a circle, a rectangle, or a polygon.

4. The OLED display substrate according to claim 3, wherein
a diameter of the orthographic projection of the common color filter on the substrate base is no more than 10 mm.

5. The OLED display substrate according to claim 1, wherein a material of the common color filter is an acrylic material.

6. The OLED display substrate according to claim 1, wherein the plurality of working color filters comprise color filters of a plurality of colors, and each working color filter of the plurality of working color filters is placed opposite to an OLED light-emitting device corresponding to the working color filter in the OLED device layer so as to filter light emitted by the OLED light-emitting device for display.

7. The OLED display substrate according to claim 6, wherein the at least one common color filter is located between the plurality of working color filters.

8. The OLED display substrate according to claim 6, wherein the at least one common color filter and one working color filter of the plurality of working color filters are made of a same material and have a same color, and a thickness of the at least one common color filter is greater than a thickness of the working color filter.

9. The OLED display substrate according to claim 6, wherein the at least one common color filter and one working color filter of the plurality of working color filters have a same thickness, and luminous transmittance of the at least one common color filter is smaller than luminous transmittance of the working color filter.

10. The OLED display substrate according to claim 1, wherein
the at least one common color filter comprises a plurality of common color filters;
orthographic projections of the plurality of working color filters on the substrate base cover orthographic projections of the plurality of working openings on the substrate base, respectively; and
orthographic projections of the plurality of common color filters on the substrate base cover at least one orthographic projection of the least one common opening on the substrate base, and at least two common color filters are provided in each common opening of the at least one common opening.

11. The OLED display substrate according to claim 10, wherein
the plurality of working color filters and the plurality of common color filters are arranged to correspond to the plurality of OLED light-emitting devices, respectively, and
the plurality of common color filters and the plurality of working color filters both comprise color filters of a plurality of colors, and a common color filter and a working color filter that have a same color are made of a same material.

12. The OLED display substrate according to claim 10, wherein luminous transmittance of the plurality of common color filters in the at least one common opening is smaller than luminous transmittance of the plurality of working color filters.

13. The OLED display substrate according to claim 12, wherein a thickness of each common color filter of the plurality of common color filters is greater than a thickness of a working color filter having a same color as the common color filter.

14. The OLED display substrate according to claim 1, wherein a material of the substrate base is a flexible material, and a material of the encapsulation layer is a transparent material.

15. A method of manufacturing an OLED display substrate, comprising:
forming an OLED device layer comprising a plurality of OLED light-emitting devices on a substrate base;
forming an encapsulation layer on respective sides of the plurality of OLED light-emitting devices away from the substrate base;
forming a black matrix layer comprising a plurality of openings on a side of the encapsulation layer away from the substrate base, such that the plurality of openings comprise a plurality of working openings and at least one common opening, and an area of an orthographic projection of each common opening of the at least one common opening on the substrate base is more than 50 times as large as an area of an orthographic projection of any working opening of the plurality of working openings on the substrate base;
forming a color filter layer on a side of the black matrix layer away from the substrate base, such that the color filter layer comprises a plurality of color filters that are provided on respective sides of the plurality of openings away from the substrate base and are placed opposite to the plurality of OLED light-emitting devices, the plurality of color filters comprise a plurality of working color filters and at least one common color filter; and orthographic projections of the plurality of working color filters on the substrate base cover orthographic projections of the plurality of working openings on the substrate base, respectively, and at least one orthographic projection of the at least one common color filter on the substrate base covers at least one orthographic projection of the least one common opening on the substrate base, respectively, and luminous transmittance of each common color filter of the at least one common color filter is smaller than luminous transmittance of any working color filter of the plurality of working color filters.

16. The method according to claim 15, wherein the forming the color filter layer on the side of the black matrix layer away from the substrate base comprises:
forming, at a temperature below 95 degrees, the plurality of working color filters and the at least one common color filter in the plurality of working openings and the at least one common opening, respectively.

17. The method according to claim 15, wherein the at least one common color filter comprises a plurality of common color filters, and the forming the color filter layer on the side of the black matrix layer away from the substrate base comprises:

forming, at a temperature below 95 degrees, the plurality of working color filters and the plurality of common color filters in the plurality of working openings and the at least one common opening, respectively, such that the plurality of working color filters and the plurality of common color filters are arranged to correspond to the plurality of OLED light-emitting devices, respectively, and orthographic projections of the plurality of working color filters on the substrate base cover orthographic projections of the plurality of working openings on the substrate base, respectively; and such that orthographic projections of the plurality of common color filters on the substrate base cover at least one orthographic projection of the at least one common opening, and at least two common color filters are provided in each common opening of the at least one common opening.

18. An OLED display apparatus, comprising the OLED display substrate according to claim 1, and at least one camera placed on a side of the substrate base of the OLED display substrate away from the color filter layer, wherein at least one orthographic projection of the at least one camera on the substrate base is located within the at least one orthographic projection of the at least one common color filter in the color filter layer of the OLED display substrate on the substrate base, respectively.

* * * * *